United States Patent [19]

Sasaki et al.

[11] 4,306,203
[45] Dec. 15, 1981

[54] FILTER

[75] Inventors: Michio Sasaki, Kawasaki; Isamu Miwa, Shichigahamamachi, both of Japan

[73] Assignee: Matsushita Electric Industrial Co., Ltd., Osaka, Japan

[21] Appl. No.: 124,732

[22] Filed: Feb. 26, 1980

[30] Foreign Application Priority Data

Mar. 2, 1979 [JP] Japan .................. 54-24858

[51] Int. Cl.³ .................. H03H 17/02; G11C 27/02; H03K 5/135
[52] U.S. Cl. .................. 333/173; 307/523; 328/151; 328/165
[58] Field of Search .................. 333/173, 172, 167, 174; 307/221 C, 221 D, 295, 304, 238, 242, 246, 231, 165, 510–527, 238.1–238.8; 328/167, 151

[56] References Cited

U.S. PATENT DOCUMENTS 4,039,979  8/1977  Carbrey .................. 333/173

*Primary Examiner*—Marvin L. Nussbaum
*Attorney, Agent, or Firm*—Stevens, Davis, Miller & Mosher

[57] ABSTRACT

A filter has a plurality of series circuits each including a reactance element and a switching element and the series circuits are connected in parallel. The switching elements are driven by clock pulses of the same period. When the switching elements are driven simultaneously, information stored in the reactance elements is cleared, whereby the filtering band can be switched over at high speed.

4 Claims, 9 Drawing Figures

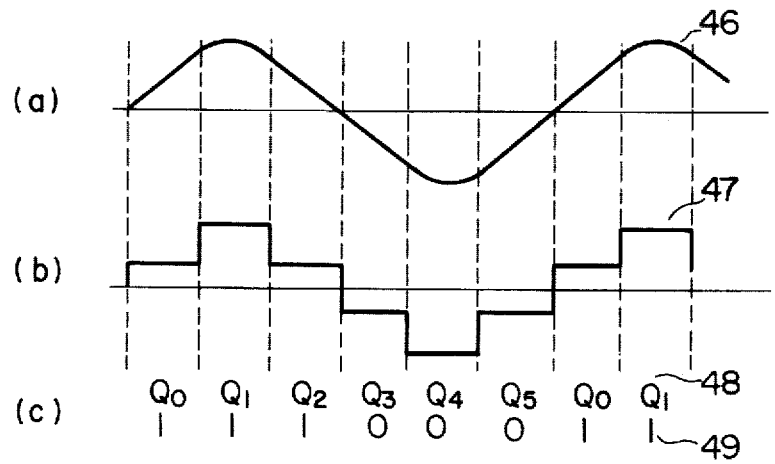
FIG. 6
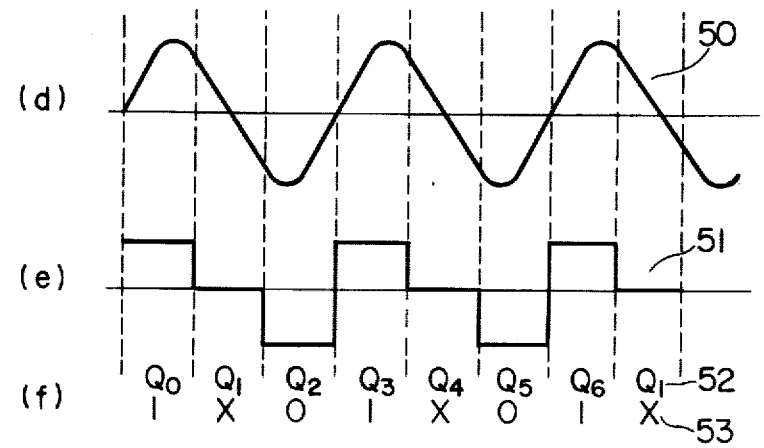
FIG. 7
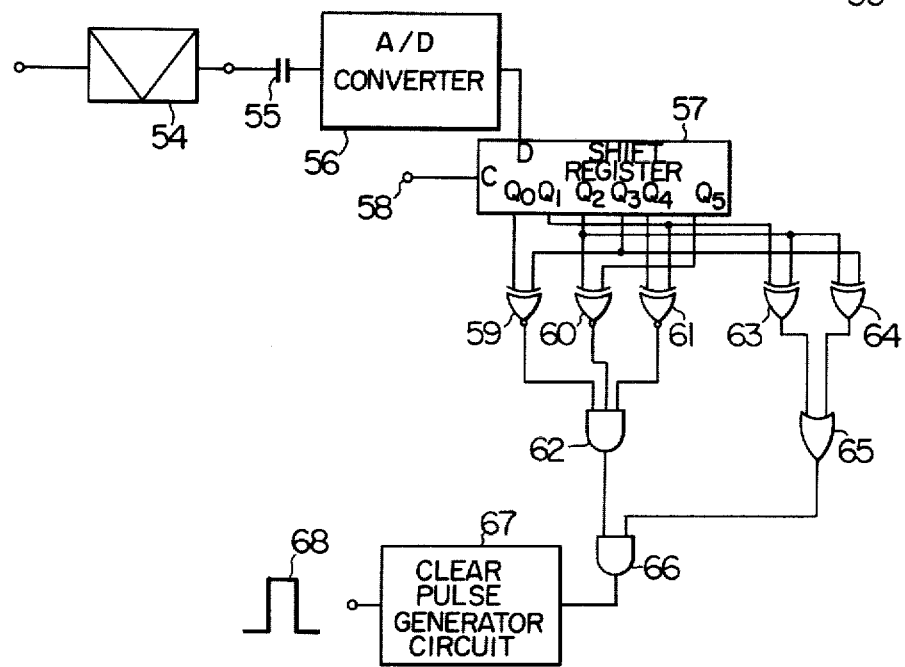

FILTER

BACKGROUND OF THE INVENTION

A variety of filters have hitherto been proposed for filtering a tone signal of a specified frequency. Of filters of this type, a conventional filter used for digital processing, that is, a digital filter will be described with reference to FIG. 1. As diagrammatically shown in FIG. 1, an input terminal 1 is connected to one end of each of a plurality of capacitors via a resistor 2. In this example, four capacitors 3, 4, 5 and 6 are employed. One end of each of the capacitors 3 to 6 is connected to one end of an input resistor 7 the other end of which is connected to a high gain amplifier 9. A feedback resistor 8 is connected across the amplifier 9 and a amplified signal is delivered from an output terminal 10. The other end of each of the capacitors 3 to 6 is connected to respective collectors of switching transistors 11, 12, 13 and 14. Signals 19, 20, 21 and 22 of different phases are applied to respective bases of the transistors 11 to 14 via resistors 15, 16, 17 and 18 during a time interval which is equal to ¼ of the period of a waiting frequency $f_o$. The transistors 11 to 14 are turned on when these signals are at high level.

In operation, an incoming signal from the input terminal 1 sequentially charges, via the resistor 2, capacitors 3 to 6 associated with respectively turned on transistors 11 to 14 during only the transistor conduction time interval. When the period of the incoming signal coincides with the switching period of the transistors 11 to 14, each of the capacitors 3 to 6 is charged each time from a corresponding same portion of the signal period. Consequently, the input signal is divided on the time division basis and an average voltage of the input signal within a time division segment is stored in each of the capacitors 3 to 6. Within a time interval subsequent to the charging interval, the incoming signal current is converted into a voltage at the amplifier 9 and an output voltage is produced therefrom.

When the period of the incoming signal is not synchronized with the switching period of the transistors 11 to 14, each of the capacitors 3 to 6 is charged by a lower (or higher) voltage than the previous, synchronized charging voltage so that the charge of the capacitor is decreased (or increased) by discharging (or charging) via the resistor 2. In such a case, the incoming signal current flows to the earth via the capacitors 3 to 6 and the amplitude of the converted output voltage from the amplifier 9 is decreased.

In this manner, only the input signal having the period which is in synchronism with the switching period of the switching transistors can always be passed on and a stable output signal develops at the output terminal 10. This type of filter having N signal branches is called an N-path filter and is known from Bell System Technical Journal, September, 1960, pp 1321-1350, for example. Recent development of MOS transistor technology permits replacement of the switching transistor 11 to 14 in FIG. 1 with FET analog switches, giving a solution to problems of the collector—emitter saturation voltage.

SUMMARY OF THE INVENTION

This digital filter is of great significance in that the waiting frequency can be varied by varying the switching frequency without affecting the band width and the gain. However, because of inherency of the filter, the rise of the amplitude, $E_{up}$ of the filtering signal when the input signal comes in is subject to, $$E_{up} = E_o(1 - e^{-\pi Bwt}) \tag{1}$$

where
  $E_o$: stationary amplitude
  $Bw$: band width
and the fall $E_{down}$ is subject to the equation, $$E_{down} = E_o e^{-\pi Bwt} \tag{2}$$

The rise and fall of the filtering signal are determined as a function of the band width. Therefore, when the rise time is decided, the fall time is also determined accordingly. When a plurality of tone signals are desired to be received continuously, irregular sensitivity for each tone signal will result from the fact that unless the subsequent input tone signal is received by the filter after the rise of the filtering signal within the filter has grown sufficiently, the rise time becomes irregular. This prevents a high speed transmission of the input signal.

Accordingly, the present invention has for its major object to provide a filter which can decrease the fall time of filtering signals.

BRIEF DESCRIPTION OF THE DRAWINGS

FIG. 6 illustrates in sections (a) through (f) waveforms useful to explain the filter of FIG. 5, FIG. 7 is a circuit diagram of a filter according to still another embodiment of the invention.

DESCRIPTION OF THE PREFERRED EMBODIMENTS

Figure 1:
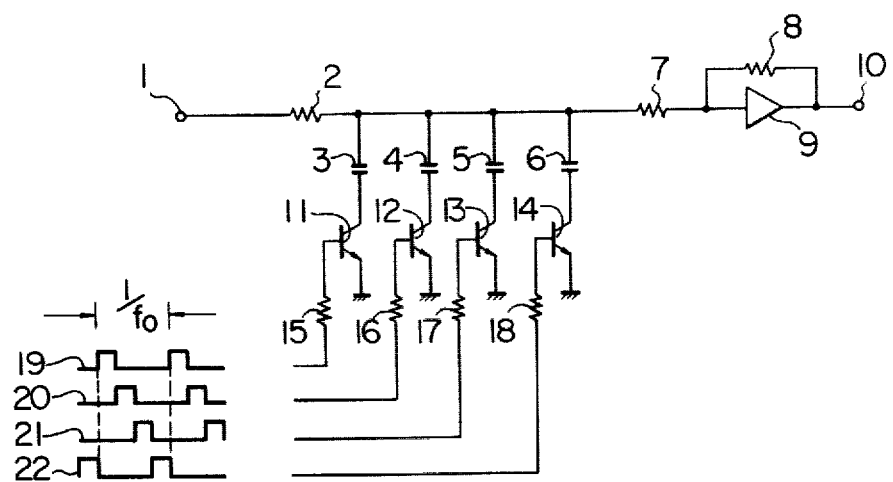
FIG. 1 is a circuit diagram to show the fundamental construction of a prior art digital filter.
Figure 2:
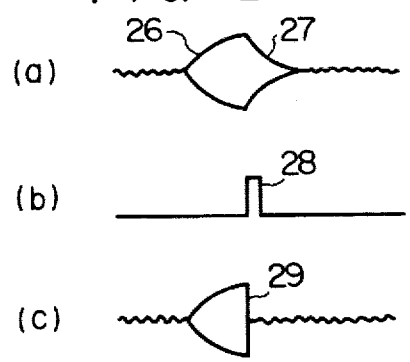
FIG. 2 illustrates in sections (a) to (c) wave forms useful to explain the digital filter of FIG. 1.
Figure 3:
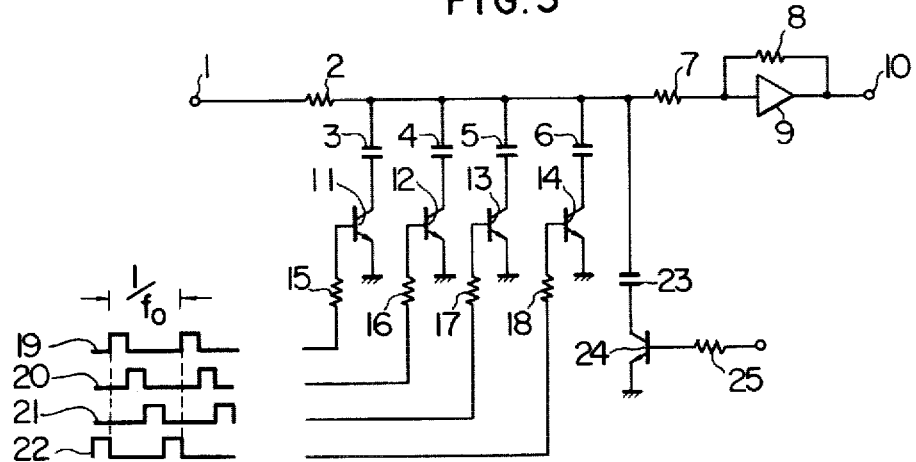
FIG. 3 is a circuit diagram of a filter according to one embodiment of the invention.

The invention will be described by way of preferred embodiments. With reference to FIG. 2, when the filter receives an input tone signal of a waiting frequency of the filter, a filtering signal rises to trace a curve subject to equation (1) as shown at 26 in section (a). If a system is so designed as to detect the fully raised filtering signal and to cause the filter to operate at another frequency to wait for the input tone signal, the filtering signal once having risen fully falls to trade a curve subject to equation (2) as shown at 27 in section (a). With such rising and falling curves, it is impossible to carry out a high speed transmission of the input signal. Therefore, as soon as the frequency is switched over, respective bases of the switching transistors 11 to 14 shown in FIG. 1 are simultaneously applied with a clear pulse as shown at 28 in section (b). Consequently, the transistors 11 to 14 are turned on simultaneously during presence of the clear pulse. Then, the charging/discharging current flows through the capacitors 3 to 6. Since the capacitors 3, 4, 5 and 6 are then brought into a parallel connection, the input tone signal is grounded through a low impedance so that the transmission of the signal current to the output side is prevented and the current to voltage converted amplitude is minimized, thus producing a waveform as shown at 29 in section (c). In this manner, it is possible to decrease the fall time of the filtering signal by simultaneously turning on the transistors 11, 12, 13 and 14 connected to the capacitors by means of the clear pulse applied and by grounding the capacitors 3 to 6. The application of the clear pulse is thus equivalent to grounding the signal line through a low impedance during the presence of the clear pulse. Accordingly, an additional circuit of a large-capacitance 23, a switching transistor 24 and a resistor 25, which circuit constitutes a separate channel from the filtering channel of the capacitors and transistors, may be provided as shown in FIG. 3 for grounding the signal line.

In this embodiment, alternating current signals are grounded. However, when two power sources of positive and negative polarities are provided for the amplifier 9, the signal line may be grounded in a direct current fashion. In such a case, the capacitor 23 can be eliminated or short-circuited.

As described above, minimization of the output amplitude can be accomplished by simultaneously turning on the switching transistors of the digital filter. This principle can also be utilized to compensate for a drawback of the digital filter. More particularly, the digital filter permits the transmission of the tone signal of the waiting frequency and of harmonics of the waiting frequency as well. The gain of the harmonics is given by, $$An = \frac{\sin\left(\frac{n}{N}\pi\right)}{\frac{n}{N}\pi} \quad (3)$$

where N is the number of capacitors and n is the order or harmonics. Accordingly, reduction in the number of the capacitors is required to increase attenuation of the harmonics. However, since the digital filter divides the coming signal on the time division basis and detects the average voltage, the difference between the phase of the incoming signal and the phase for the time division leads to irregularities in the maximum output amplitude which are increased as the number of the division segments, that is, the number of the capacitors decreases. Also, it is necessary to increase the number of the capacitors for the sake of improving fidelity of the output signal wave form with respect to the input signal waveform. This invention can compensate for the disadvantage in which the attenuation of the harmonics is decreased with the increased number of the capacitors.

Figure 4:
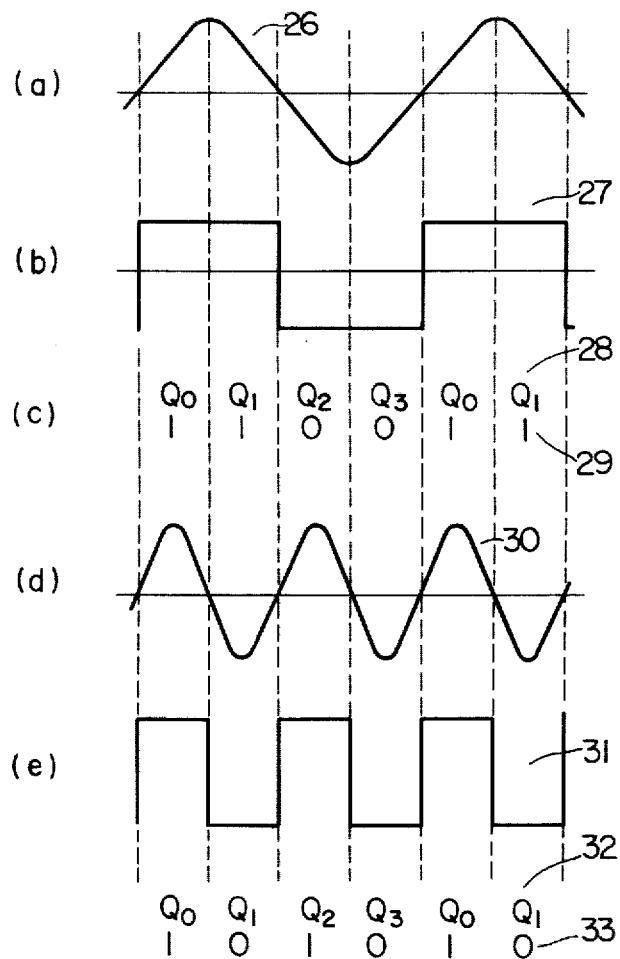
FIG. 4 illustrates in sections (a) through (e) waveforms useful to explain the filter of FIG. 3.

Such a function will be described for the number of the capacitors being four with reference to FIG. 4. When an input signal of a frequency which is in synchronism with the switching period of the switching elements, as designated at 26 in section (a) of FIG. 4, is received by the filter, this signal is divided into four segments $Q_0$, $Q_1$, $Q_2$ and $Q_3$ as shown at 28 in section (c). On the other hand, if the incoming signal is converted into a digital signal of logics "1" and "0", an output waveform of the filter as shown at 27 is then converted into a digital code in synchronism with periods of the division segments $Q_0$, $Q_1$, $Q_2$ and $Q_3$, which digital code is "1100" as shown at 29 in section (c). Similarly, upon receipt of the second harmonic as designated at 30 in section (d), this harmonic can be converted into a digital signal of logics "1" and "0" to produce an output wave form of the filter as shown at 31 in section (e) which is a digital code of "1010". Based on this principle, according to the invention, digitalization of the filter output signal is first effected and the clear pulse is generated when the information successively appears in form of "1, 0, 1, 0 . . ."

Figure 5:
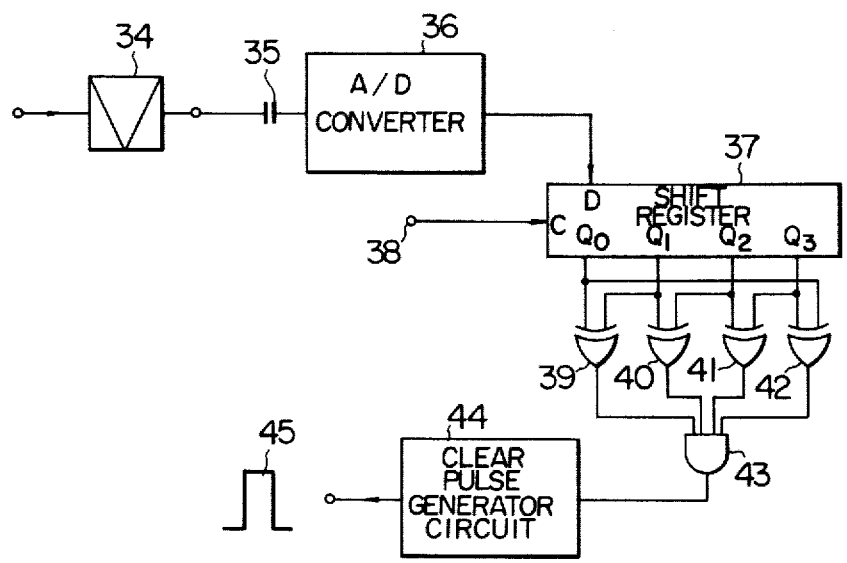
FIG. 5 is a circuit diagram of a filter according to another embodiment of the invention.

An example of a circuit for this purpose is shown in FIG. 5. The output of a digital filter 34 is connected to an analog to digital converter 36 via a coupling capacitor 35. Accordingly, the incoming signal, although undergoing slight attenuation, is always transmitted and converted into a digital signal of logics "1" and "0". This digital signal is coupled to a shift register 37 which receives at an input terminal 38 a clock pulse of a frequency which is four times the clock frequency for the filter, i.e., the waiting frequency, and hence the clock applied to the input 38 is obviously synchronized with the switching period of the switching elements. Two adjacent output digits of the shift register 37 are compared at exclusive—OR gates 39, 40, 41 and 42 so that when the output code of the shift register is "1, 0, 1, 0" or "0, 1, 0, 1", it is ANDed at an AND gate 43, producing a high output. This high output is coupled to a clear pulse generator circuit 44 which in turn produces a clear pulse 45 for simultaneous closure of output circuits of the capacitors in the digital filter.

The foregoing embodiment as explained with reference to FIGS. 4 and 5 is with four sets of capacitors and switching elements. The following description is for six sets by referring to FIGS. 6 and 7. Upon reception of an input signal 46 as shown in section (a) of FIG. 6 in synchronism with the switching period, a digitalized output waveform 47 as shown in section (b) is converted, in synchronism with division segments of switching period $Q_0$, $Q_1$, $Q_2$, $Q_3$, $Q_4$ and $Q_5$ as shown at 48 in section (c), into a digital code which is "1, 1, 1, 0, 0, 0". A digitalized output waveform 51 as shown in section (e) corresponding to a received second harmonic 50 of the input signal as shown in section (d) is converted, in synchronism with division segments of switching period as designated at 52 in section (f), into a digital code as shown at 53 in section (f) which is "1×01×0". Symbol "x" herein designates an indefinite state which belongs either to "1" or "0". In other words, the output waveform as denoted by "x" is at an intermediate level between high and low levels and is prone to "1" or "0" dependent on offset of the digital encoder. From FIG. 6, it can be understood that digital codes corresponding to the division segments $Q_n$ and $Q_{n+3}$ (n=0, 1, 2) are the same. This nature is utilized to detect the reception of the second harmonic and to produce the clear pulse.

An exemplary circuit based on this principle is shown in FIG. 7. The output of a digital filter 54 is connected to an analog to digital converter 56 via a coupling capacitor 55. Accordingly, the incoming signal, although undergoing slight attenuation, is always transmitted and converted into a digital signal of logics "1" and "0". This digital signal is coupled to a shift register 57 which receives at an input terminal 58 a clock pulse of a frequency which is six times the clock frequency for the filter, i.e., the waiting frequency and hence it is obviously synchronized with the switching period of the switching elements. Of outputs of the shift register, digital codes corresponding to the division segments $Q_n$ and $Q_{n+3}$ (n=0, 1, 2) are exclusive NORed at exclusive-NOR gates 59, 60 and 61. The respective exclusive-NOR gates deliver out a high output simultaneously when receiving the same logic of the digital codes to cause an AND gate 62 to produce a high output. Thus, it is detected that the outputs of $Q_n$ and $Q_{n+3}$ are of the same code. On the other hand, when the filter is receiving a noise signal, this noise signal converted into a digital signal is a random digital signal of logics "1" and "0". However, at the timing when the switching elements are closed simultaneously by the clear pulse, the output level of the digital signal representative of the noise signal is minimized and when this output is converted into a digital code, it is represented by "1, 1, 1, 1, 1, 1" or "0, 0, 0, 0, 0, 0". As a result, when receiving the noise signal, the digital codes corresponding to the division segments $Q_n$ and $Q_{n+3}$ bear the same logic and the AND gate 62 is caused to produce a high output. Therefore, it is necessary to inhibit the delivery of the successive digital codes which are effective to control the clear pulse. To this end, exclusive-OR gates 63 and 64 are provided. The gates 63 and 64 monitor two adjacent digital codes and when receiving the same logic in respect of $Q_1$, $Q_2$ and $Q_3$, they cause an OR-gate 65 to produce a low output which in turn inhibits the output of the AND gate 62. When receiving a random signal, one of logics in respect of $Q_1$, $Q_2$ and $Q_3$ is different so that the output of the OR gate 65 is high and it does not inhibit the output of the AND gate 62. When the second harmonics is received by the filter, as described above, the output of the AND gate 62 is high, the output of the OR gate 65 is also high and hence the output of an AND gate 66 is high, thereby sending a high signal to a clear pulse generator circuit 67. The clear pulse generator circuit 67 thus receiving the high signal produces a clean pulse 68 which acts to effect the simultaneous closure of the switching elements for the capacitors. In this manner, reception of the harmonics is detected sufficiently prior to the rise of the filtering signal and the simultaneous closure of the switching elements for the capacitors is accomplished so that the filter output can be minimized and the suppression of the output of the harmonics can be achieved.

The above operation will be further detailed with reference to a time chart in FIG. 8. In the figure, the clock pulse applied to the shift register 57 is illustrated at 69 in section (a), the output of the A/D converter 56 is illustrated in section (b), $Q_0, Q_1 \ldots Q_5$ outputs of the shift register 57 are illustrated at 70 in section (c), the outputs of the exclusive-NOR gates 59, 60 and 61 are illustrated in sections (d), (e) and (f), the output of the AND gate 62 is illustrated at 71 in section (g), the output of the OR gate 65 is illustrated in section (h), the output of the AND gate 66 is illustrated at 72 in section (i), and the clear pulse is illustrated at 73 in section (j).

Figure 8:
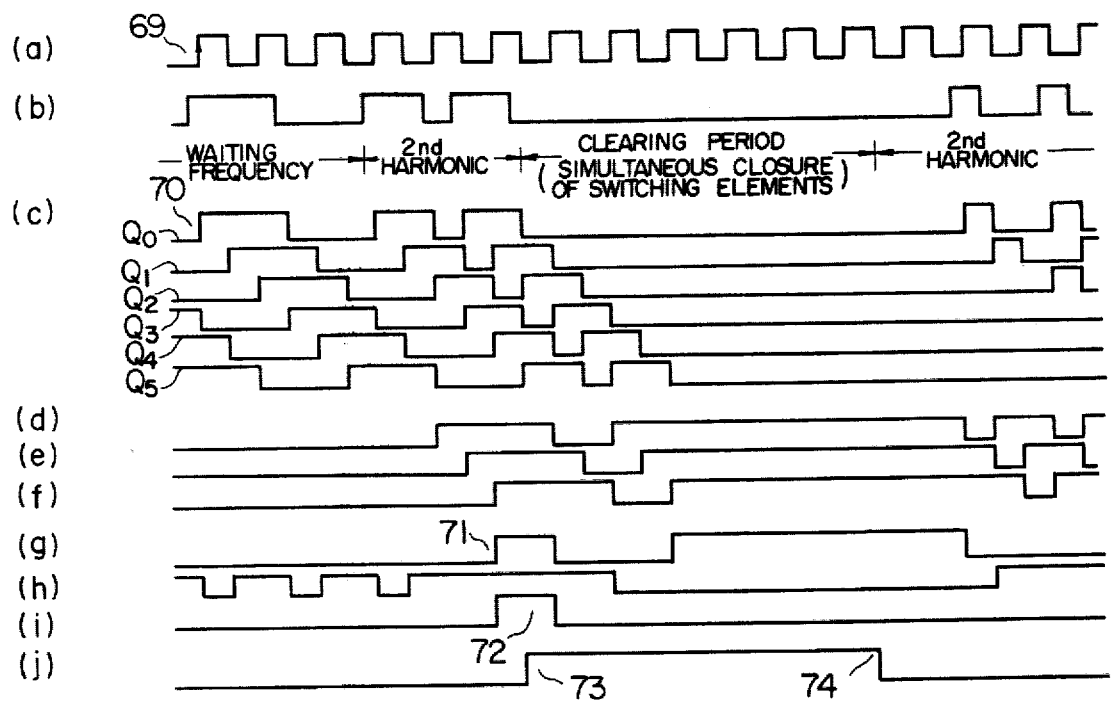
FIG. 8 illustrates in sections (a) through (j) waveforms useful to explain the filter of FIG. 7.

FIG. 8 illustrates such a case in which the reception of the tone signal of the waiting frequency is interrupted and changed to the reception of the second harmonic. The clock pulses for switching operations in the digital filter are identical and the number of the capacitors is six. Accordingly, each of the switching elements is closed during one period of the six periods. The shift register 57 is synchronized with these clock pulses so that the output of the A/D converter 56 and hence the output of the shift register 57 is shifted in synchronization with the rise of the clock pulse 69 as shown at 70. When receiving the tone signal of the waiting frequency, $Q_n$ and $Q_{n+3}$ (n=0, 1, 2) are different logics and hence the output of the AND gate 62 for controlling the clear pulse is obviously maintained at low level. Subsequently, upon reception of the second harmonic, the digitalized information is successively fed to the shift register 57. Then, $Q_n$ and $Q_{n+3}$ (n=0, 1, 2) of the same logic are detected at the exclusive-NOR gates 59, 60 and 61 and the AND gate 65 becomes high level as shown at 71, thereby determining that the received signal is the second harmonic. At the same time, it is determined by the OR gate 65 that the input information is not the offset code, that is, it is not the clearing period. According to this determination the AND gate 66 eventually produces the clear pulse control signal as shown at 72. When receiving this high level information, the clear pulse generator circuit 67 produces the clear pulse 73 which is delayed by one period with respect to the clock pulse. High level of the clear pulse extends over 12 periods of the clock pulse and the clear pulse falls at timing as shown at 74. The width of the clear pulse is necessary to cover the fall time of the filtering signal and may satisfactorily be 10 to 20 periods in terms of the clock period. Upon successive reception of the second harmonic, the subsequent second harmonic is also digitalized to produce the clear pulse.

Figure 9:
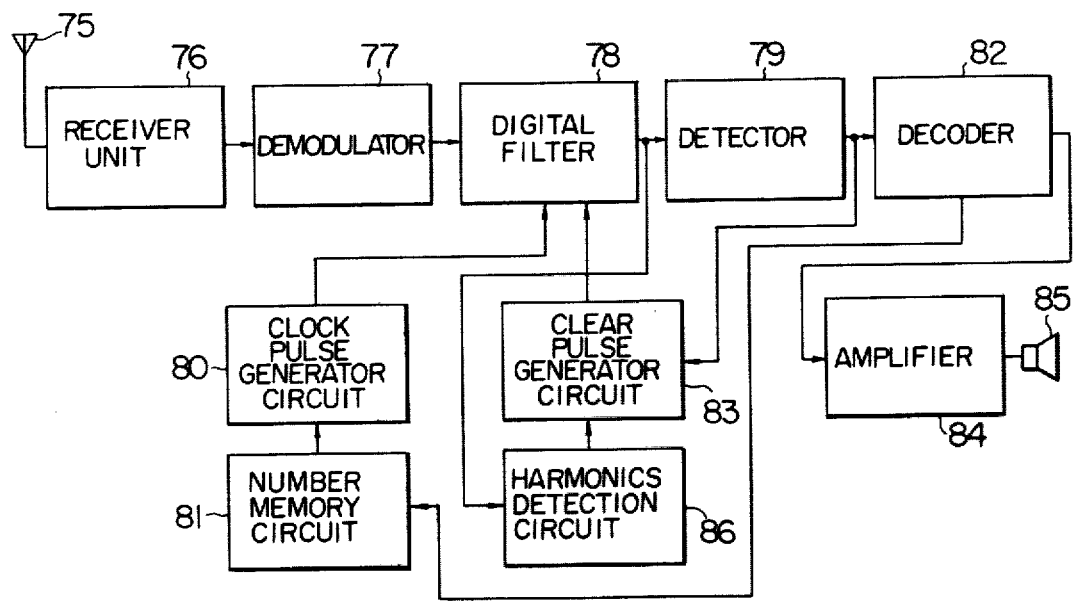
FIG. 9 is a block diagram of a selective call system embodying the invention.

Reference is now made to FIG. 9 in which invention is applied to a serial 5-tone selective call system. A radio frequency signal modulated with a serial 5-tone signal is received by an antenna 75 and coupled to a receiver unit 76. The tone signal is demodulated at a demodulator 77 and coupled to a digital filter 78. When the incoming first tone signal is in coincidence with a waiting frequency of the filter, a detector 79 detects this tone signal to produce a detected pulse. A clock pulse generator circuit 80 is provided for determining the period of the switching operation in the digital filter 78. The clock pulse is generated by dividing the frequency of an original clock and the frequency division ratio depends on the frequency of the tone to be waited for, i.e., the selective call number.

This frequency division ratio is stored in a number memory circuit 81. When a decoder 82 receives the detected pulse of the first tone, it instructs the number memory circuit 81 to make the clock pulse generator circuit 80 generate a frequency division ratio which corresponds to the second tone. The clock pulse generator circuit 80 thus divides the original clock to generate a clock which corresponds to the second tone. Consequently, the digital filter is switched to wait for the second tone. During such a switchover, a clear pulse generator circuit 83 produces a clear pulse such as described with reference to FIG. 2 in order to rapidly remove energy of the first tone and to place the filter in condition for reception of the second tone and the switching elements of the filter are then closed simultaneously. In this way, the filter can be reset and placed rapidly in condition for waiting for the second tone. Subsequently, the coming second tone is received and detected by the detector 79, as in the first tone and a detected pulse is produced. As far as the incoming signal is in coincidence with a predetermined five-tone sequence which is determined by the number memory circuit 81, the detector 79 produces five detected pulses. The decoder 82 then continuously produces audio frequency pulses which in turn are amplified to an amplifier 84 for energization of an electro-mechanical transducer 85. The transducer 85 makes a sound to advise a person carrying this receiver set of his call. The output of the digital filter 78 is also connected to a harmonics detection circuit 86 such as described with reference to FIGS. 4, 5, 6, 7 and 8. Accordingly, upon reception of harmonics of the waiting frequency, the detection circuit 86 acts on the clear pulse generator circuit 83 so that a clear pulse can be generated before the output of the filter 78 rises up to the detection level of the detector 79. As a result, the filter output can be minimized to inhibit the decoder 82 from responding to the harmonics.

As described above, in the tone signal transmission in this embodiment, it is possible to determine the length of signal in consideration of only the rise time of the filtering signal, without necessity of taking the fall time into consideration. The transmission signal length of each of the five tones in this embodiment is 33 msec. and the band width of the receiver filter is 15 Hz.

We claim:

1. A filter wherein a plurality, n, of reactance elements branch in parallel from a serial reception signal line and switching elements respectively associated with said n reactance elements are successively driven by n clock pulses having a period equal to that of a desired reception frequency to successively charge/discharge said reactance elements whereby said desired reception signal frequency is passed through said filter, said filter further comprising: means for varying the frequency of the clock pulses for changing reception frequency; and means for simultaneously releasing energy stored in said plurality of reactance elements at the time said reception frequency is altered, thereby reducing the decay time of the stored energy and to initialize the voltage of said reactance elements for reception of said altered frequency.

2. A filter wherein a plurality, n, of reactance elements branch in parallel from a serial reception signal line and switching elements respectively associated with said n reactance elements are successively driven by n clock pulses having a period equal to that of a desired reception frequency to successively charge/discharge said reactance elements whereby said desired reception frequency is passed through said filter, said filter further comprising: means for varying the frequency of the clock pulses in compliance with a change in the reception signal frequency; and means for clearing information stored in said reactance elements at the same time said reception frequency is altered, said clearing means including at least one of means for driving simultaneously said switching elements and means for grounding said serial reception signal line having said plurality of reactance elements connected thereto.

3. In a filter wherein a plurality, n, of reactance elements branch in parallel from a serial reception signal line and switching elements respectively associated with said n reactance elements are successively driven by n-phase clock pulses having a period equal to that of a desired reception frequency to successively charge/discharge said reactance elements whereby a desired reception frequency is passed through said filter, the improvement which comprises means for effecting analog to digital conversion of the output signal of said filter, and means for discriminating a harmonic of the reception frequency by comparing an arrangement of the digitalized signal with a predetermined arrangement of the harmonic.

4. A filter according to claim 3 wherein there is provided means for clearing information stored in each of said reactance elements when said discriminating means detects the harmonic.

* * * * *